(12) United States Patent
Doherty et al.

(10) Patent No.: US 10,381,251 B2
(45) Date of Patent: Aug. 13, 2019

(54) AUTOMATED MATERIAL HANDLING SYSTEM FOR SEMICONDUCTOR MANUFACTURING BASED ON A COMBINATION OF VERTICAL CAROUSELS AND OVERHEAD HOISTS

(75) Inventors: Brian J. Doherty, Weston, MA (US); Thomas R. Mariano, Londonderry, NH (US); Robert P. Sullivan, Wilmington, MA (US)

(73) Assignee: Murata Machinery Ltd., Kyoto (JP)

( * ) Notice: Subject to any disclaimer, the term of this patent is extended or adjusted under 35 U.S.C. 154(b) by 0 days.

(21) Appl. No.: 13/492,341

(22) Filed: Jun. 8, 2012

(65) Prior Publication Data
US 2012/0288348 A1 Nov. 15, 2012

Related U.S. Application Data

(63) Continuation of application No. 12/724,194, filed on Mar. 15, 2010, now Pat. No. 8,197,172, which is a
(Continued)

(51) Int. Cl.
*H01L 21/677* (2006.01)
*B65G 1/04* (2006.01)

(52) U.S. Cl.
CPC ...... *H01L 21/67733* (2013.01); *B65G 1/0457* (2013.01); *H01L 21/67736* (2013.01); *H01L 21/67769* (2013.01)

(58) Field of Classification Search
CPC ......... H01L 21/67769; H01L 21/67775; H01L 21/67733; B65G 47/61; B65G 37/02;
(Continued)

(56) References Cited

U.S. PATENT DOCUMENTS 328,408 A 10/1885 Isbell
343,293 A 6/1886 Bowen
(Continued)

FOREIGN PATENT DOCUMENTS

DE 3825401 1/1990
DE 3825401 A1 1/1990
(Continued)

OTHER PUBLICATIONS

Campbell, "Overhead Intrabay Automation and Microstocking—a virtual fab case study," *IEEE/SEMI Advanced Semiconductor Manufacturing Conference*, pp. 368-372 (1997).
(Continued)

*Primary Examiner* — Glenn F Myers
(74) *Attorney, Agent, or Firm* — Fish & Richardson P.C.

(57) ABSTRACT

An overhead hoist transport vehicle comprising: an overhead hoist; a translating stage; and a gripper coupled to the translating stage, the gripper being configured to grip a material unit; wherein the overhead hoist is configured to transport the material unit to one of a load port and a storage location by performing operations comprising: the overhead hoist being configured to vertically move the gripper to the load port and the storage location; and the translating stage being configured to horizontally move the overhead hoist to the load port and the storage location; and wherein the load port is beneath an overhead rail; and wherein at least a portion of the storage location is disposed lateral to the overhead rail.

16 Claims, 7 Drawing Sheets

Related U.S. Application Data continuation of application No. 11/652,707, filed on Jan. 12, 2007, now Pat. No. 7,771,153, which is a continuation of application No. 10/393,526, filed on Mar. 20, 2003, now Pat. No. 7,165,927.

(60) Provisional application No. 60/389,993, filed on Jun. 19, 2002, provisional application No. 60/417,993, filed on Oct. 11, 2002.

(58) Field of Classification Search
CPC ......... B65G 1/0457; B66C 1/28; B66C 11/02; B65H 67/065; B25J 5/04; B25J 5/0093; B25J 5/026; B25J 5/02
USPC ......... 414/331.02, 331.03, 331.14, 318, 935, 414/561, 591, 659, 660, 751.1, 785, 266, 414/268, 269, 277, 279, 282, 589, 222.01, 414/940, 682, 680, 560, 217, 217.1, 414/222.07, 280, 222.03, 225.01; 294/81.54, 81.62; 212/168, 332, 84; 198/468.2, 470.1, 750.11, 803.3
See application file for complete search history.

(56) References Cited

U.S. PATENT DOCUMENTS

| | | | |
|---|---|---|---|
| 1,352,947 A | 9/1920 | Fiske | |
| 2,317,689 A | 4/1943 | Medenwald | |
| 2,827,189 A * | 3/1958 | Knudstrup | 414/607 |
| 3,042,227 A | 7/1962 | Tantlinger | |
| 3,049,247 A | 8/1962 | Lemelson | |
| 3,119,501 A | 1/1964 | Lemelson | |
| 3,422,967 A | 1/1969 | Aron | |
| 3,467,264 A * | 9/1969 | Boytz et al. | 414/283 |
| 3,499,554 A | 3/1970 | Davis et al. | |
| 3,531,002 A | 9/1970 | Lemelson | |
| 3,583,584 A | 6/1971 | Iacco | |
| 3,700,121 A | 10/1972 | McManus | |
| 3,701,442 A | 10/1972 | Dunning et al. | |
| 3,750,804 A | 8/1973 | Lemelson | |
| 3,762,531 A | 10/1973 | Lee | |
| 3,770,137 A | 11/1973 | Slutsky et al. | |
| 3,883,203 A | 5/1975 | Lexe | |
| 3,968,885 A * | 7/1976 | Hassan et al. | 414/591 |
| 4,088,232 A | 5/1978 | Lilly | |
| 4,190,013 A | 2/1980 | Otis et al. | |
| 4,243,147 A | 1/1981 | Twitchell et al. | |
| 4,311,427 A | 1/1982 | Coad et al. | |
| 4,398,630 A | 8/1983 | Brems | |
| 4,457,661 A | 7/1984 | Flint et al. | |
| 4,540,326 A | 9/1985 | Southworth et al. | |
| 4,541,769 A | 9/1985 | Clemens | |
| 4,642,017 A | 2/1987 | Fenn | |
| 4,668,484 A | 5/1987 | Elliot | |
| 4,676,560 A | 6/1987 | Schmitz et al. | |
| 4,682,927 A | 7/1987 | Southworth et al. | |
| 4,697,239 A | 9/1987 | Sicard et al. | |
| 4,756,657 A | 7/1988 | Kinney | |
| 4,775,281 A | 10/1988 | Prentakis | |
| 4,776,744 A | 11/1988 | Stonestreet et al. | |
| 4,801,236 A | 1/1989 | Katzenschwanz | |
| 4,816,116 A | 3/1989 | Davis et al. | |
| 4,886,412 A | 12/1989 | Wooding et al. | |
| 4,903,610 A | 2/1990 | Matsumoto et al. | |
| 4,934,767 A | 6/1990 | Hoyt et al. | |
| 4,979,360 A | 12/1990 | Kallmann et al. | |
| 5,064,337 A | 11/1991 | Asakawa et al. | |
| 5,083,262 A | 1/1992 | Haff | |
| 5,096,357 A | 3/1992 | Galbani | |
| 5,128,912 A | 7/1992 | Hug et al. | |
| 5,324,155 A | 6/1994 | Goodwin et al. | |
| 5,380,139 A | 1/1995 | Pohjonen et al. | |
| 5,417,537 A | 5/1995 | Miller | |
| 5,536,128 A * | 7/1996 | Shimoyashiro et al. | 414/273 |
| 5,570,990 A * | 11/1996 | Bonora et al. | 414/543 |
| 5,603,777 A * | 2/1997 | Ohashi | 134/25.4 |
| 5,615,988 A | 4/1997 | Wiesler et al. | |
| 5,628,604 A | 5/1997 | Murata et al. | |
| 5,630,692 A | 5/1997 | Hanaya | |
| 5,647,718 A | 7/1997 | Wiesler et al. | |
| 5,655,870 A | 8/1997 | Yasuhara et al. | |
| 5,741,109 A | 4/1998 | Wiesler et al. | |
| 5,751,581 A | 5/1998 | Tau et al. | |
| 5,836,662 A | 11/1998 | Robey | |
| 5,893,795 A | 4/1999 | Perlov et al. | |
| 5,909,997 A * | 6/1999 | Liljengren et al. | 414/751.1 |
| 5,947,802 A | 9/1999 | Zhang et al. | |
| 5,980,183 A | 11/1999 | Fosnight | |
| 5,993,148 A | 11/1999 | Brown | |
| 6,002,840 A | 12/1999 | Hofmeister | |
| 6,035,245 A | 3/2000 | Conboy et al. | |
| 6,050,768 A | 4/2000 | Iwasaki et al. | |
| 6,068,437 A | 5/2000 | Boje et al. | |
| 6,078,845 A | 6/2000 | Friedman | |
| 6,086,457 A | 7/2000 | Perlov et al. | |
| 6,092,678 A | 7/2000 | Kawano et al. | |
| 6,095,054 A | 8/2000 | Kawano et al. | |
| 6,102,647 A * | 8/2000 | Yap | B65G 1/127 414/467 |
| 6,113,341 A | 9/2000 | Fukushima | |
| 6,129,496 A | 10/2000 | Iwasaki et al. | |
| 6,134,482 A | 10/2000 | Iwasaki | |
| 6,169,935 B1 * | 1/2001 | Iwasaki et al. | 700/214 |
| 6,183,184 B1 | 2/2001 | Shiwaku | |
| 6,240,335 B1 | 5/2001 | Wehrung et al. | |
| 6,251,155 B1 | 6/2001 | Fukushima | |
| 6,303,398 B1 | 10/2001 | Goerigk | |
| 6,308,818 B1 | 10/2001 | Bonora et al. | |
| 6,315,512 B1 | 11/2001 | Tabrizi et al. | |
| 6,336,546 B1 | 1/2002 | Lorenz | |
| 6,356,256 B1 | 3/2002 | Leftwich | |
| 6,356,804 B1 | 3/2002 | Conboy et al. | |
| 6,361,422 B1 | 3/2002 | Ettinger et al. | |
| 6,364,593 B1 | 4/2002 | Hofmeister et al. | |
| 6,398,476 B1 * | 6/2002 | Ando | 414/282 |
| 6,439,822 B1 * | 8/2002 | Kimura et al. | 414/331.04 |
| 6,450,318 B1 * | 9/2002 | Minardi | 198/346.3 |
| 6,453,574 B1 | 9/2002 | Chen | |
| 6,460,711 B1 | 10/2002 | Kato et al. | |
| 6,504,144 B1 | 1/2003 | Murata | |
| 6,519,502 B2 | 2/2003 | Chao | |
| 6,530,735 B1 * | 3/2003 | Trammell | 414/275 |
| 6,564,120 B1 | 5/2003 | Richard et al. | |
| 6,579,052 B1 | 6/2003 | Bonora et al. | |
| 6,604,624 B2 | 8/2003 | Hirata et al. | |
| 6,695,120 B1 | 2/2004 | Trammell | |
| 6,715,978 B2 | 4/2004 | Lin et al. | |
| 6,726,429 B2 | 4/2004 | Sackett | |
| 6,748,282 B2 | 6/2004 | Lin | |
| 6,758,647 B2 | 7/2004 | Kaji et al. | |
| 6,775,918 B2 * | 8/2004 | Tseng et al. | 33/645 |
| 6,812,926 B1 | 11/2004 | Rugge | |
| 6,881,020 B2 * | 4/2005 | Chang et al. | 414/217.1 |
| 7,023,440 B1 | 4/2006 | Havekost et al. | |
| 7,165,927 B2 | 1/2007 | Doherty et al. | |
| 7,292,245 B2 | 11/2007 | Goggin | |
| 7,441,999 B2 | 10/2008 | Nakao et al. | |
| 7,570,262 B2 | 8/2009 | Landau et al. | |
| 7,686,176 B2 | 3/2010 | Murata | |
| 7,771,153 B2 | 8/2010 | Doherty et al. | |
| 7,907,140 B2 | 3/2011 | Landau et al. | |
| 8,113,844 B2 | 2/2012 | Huang et al. | |
| 8,197,172 B2 | 6/2012 | Doherty et al. | |
| 8,224,953 B2 | 7/2012 | Childers | |
| 8,269,620 B2 | 9/2012 | Bullemer et al. | |
| 8,271,892 B2 | 9/2012 | Duncker et al. | |
| 9,620,397 B2 | 4/2017 | Doherty et al. | |
| 9,881,823 B2 | 1/2018 | Doherty et al. | |
| 10,141,212 B2 | 11/2018 | Doherty et al. | |
| 10,147,627 B2 | 12/2018 | Doherty et al. | |
| 2001/0014268 A1 | 8/2001 | Bryson, III et al. | |
| 2002/0025244 A1 | 2/2002 | Kim | |
| 2002/0105236 A1 | 8/2002 | Fosnight et al. | |

(56) References Cited

U.S. PATENT DOCUMENTS

| | | |
|---|---|---|
| 2002/0143426 A1 | 10/2002 | Chao |
| 2002/0143427 A1 | 10/2002 | Chao |
| 2002/0182037 A1 | 12/2002 | Kimoto et al. |
| 2002/0182040 A1* | 12/2002 | Kimura et al. .......... 414/331.04 |
| 2002/0187024 A1 | 12/2002 | Nulman |
| 2002/0197136 A1 | 12/2002 | Huang et al. |
| 2003/0014699 A1 | 1/2003 | Kallela |
| 2003/0023518 A1 | 1/2003 | Spriggs |
| 2003/0156928 A1 | 8/2003 | Sackett et al. |
| 2003/0190223 A1 | 10/2003 | Peiter |
| 2003/0198540 A1 | 10/2003 | Lin et al. |
| 2003/0235486 A1 | 12/2003 | Doherty et al. |
| 2004/0027349 A1 | 2/2004 | Landau et al. |
| 2004/0101386 A1 | 5/2004 | Robey |
| 2004/0109746 A1 | 6/2004 | Suzuki |
| 2004/0126208 A1 | 7/2004 | Tawyer et al. |
| 2004/0191032 A1 | 9/2004 | Foulke et al. |
| 2005/0097471 A1 | 5/2005 | Faraday et al. |
| 2005/0162423 A1 | 7/2005 | Goggin |
| 2005/0177790 A1 | 8/2005 | Molander et al. |
| 2005/0261999 A1 | 11/2005 | Rowady |
| 2006/0074598 A1 | 4/2006 | Emigholz et al. |
| 2007/0018984 A1 | 1/2007 | Sauvageau |
| 2007/0110547 A1 | 5/2007 | Doherty et al. |
| 2007/0242688 A1 | 10/2007 | McFarland |
| 2008/0313560 A1 | 12/2008 | Dalal |
| 2009/0088534 A1 | 4/2009 | Scheie et al. |
| 2009/0183095 A1 | 7/2009 | Deitsch et al. |
| 2010/0174405 A1 | 7/2010 | Doherty et al. |
| 2012/0288348 A1 | 11/2012 | Doherty et al. |
| 2014/0119857 A1 | 5/2014 | Doherty et al. |
| 2015/0303087 A1 | 10/2015 | Doherty et al. |
| 2015/0303088 A1 | 10/2015 | Doherty et al. |
| 2015/0303089 A1 | 10/2015 | Doherty et al. |

FOREIGN PATENT DOCUMENTS

| | | |
|---|---|---|
| DE | 3825401 | 7/1990 |
| EP | 1063056 A2 | 12/2000 |
| EP | 1 202 325 | 5/2002 |
| EP | 1 202 325 A1 | 5/2002 |
| JP | 62-297050 | 12/1987 |
| JP | 63-37626 | 2/1988 |
| JP | 01-285512 | 11/1989 |
| JP | H 0227838 | 2/1990 |
| JP | 2-117506 | 5/1990 |
| JP | 03-177205 | 8/1991 |
| JP | H03177205 | 8/1991 |
| JP | 3-225847 | 10/1991 |
| JP | 5-186050 | 7/1993 |
| JP | 5-77183 | 10/1993 |
| JP | 5-278853 | 10/1993 |
| JP | 6-20388 | 3/1994 |
| JP | 06053578 | 7/1994 |
| JP | H06053578 U1 | 7/1994 |
| JP | H06053835 U1 | 7/1994 |
| JP | H 0661487 | 8/1994 |
| JP | 2548081 | 5/1997 |
| JP | 09-315521 | 9/1997 |
| JP | 10-45213 | 2/1998 |
| JP | 10045213 A | 2/1998 |
| JP | A 10-045213 | 2/1998 |
| JP | H10045213 | 2/1998 |
| JP | 10250835 U1 | 9/1998 |
| JP | 11-016981 | 1/1999 |
| JP | 11-100120 | 4/1999 |
| JP | H11180505 | 7/1999 |
| JP | 2000-053237 | 2/2000 |
| JP | 2000-53237 | 2/2000 |
| JP | 2000-150622 | 5/2000 |
| JP | 2000-161457 | 6/2000 |
| JP | 2000-188316 | 7/2000 |
| JP | 2000-255710 | 9/2000 |
| JP | 2000-289975 | 10/2000 |
| JP | 2001-31216 | 2/2001 |
| JP | 2001-031216 | 2/2001 |
| JP | 2001-093957 | 4/2001 |
| JP | 2001-144169 | 5/2001 |
| JP | 2001-158506 | 6/2001 |
| JP | 2001-171970 | 6/2001 |
| JP | 2001-242978 | 9/2001 |
| JP | 2001-354302 | 12/2001 |
| JP | 2004-512692 | 4/2004 |
| JP | 4626302 B | 2/2011 |
| JP | 2011-115010 | 6/2011 |
| JP | 2011-231707 | 11/2011 |
| JP | 4831521 B | 12/2011 |
| JP | 2014-003564 | 1/2014 |
| JP | 05-435414 | 3/2014 |
| SE | 524799 | 10/2004 |
| SU | 1326512 A1 | 3/1986 |
| WO | WO 98/46503 | 3/1998 |
| WO | WO 1998/46503 | 10/1998 |
| WO | WO 99/02436 | 1/1999 |
| WO | WO 1999/02436 | 1/1999 |
| WO | 1999/013495 | 3/1999 |
| WO | 2000/33355 | 6/2000 |
| WO | WO 00/37338 | 6/2000 |
| WO | WO 2000/37338 | 6/2000 |
| WO | WO 01/13408 | 2/2001 |
| WO | WO 2001/13408 | 2/2001 |
| WO | WO 2001/55805 | 8/2001 |
| WO | WO 01/96884 | 12/2001 |
| WO | WO 2001/96884 | 12/2001 |
| WO | WO 2002/035583 | 5/2002 |
| WO | WO2002035583 | 5/2002 |

OTHER PUBLICATIONS

Kaempf , "Automated Wafer Transport in the Wafer Fab," *IEEE/SEMI Advanced Semiconductor Manufacturing Conference*, pp. 356-361 (1997).

Kuo, "Modelling and Performance Evaluation of an Overhead Hoist Trasnport System in a 300 mm Fabrication Plant," *Int. J. Adv. Manuf. Technol.*, vol. 20, pp. 153-161 (2002).

Sikich, "Development and Implementation of an Automated Wafer Transport System," *IEEE/SEMI Advanced Semiconductor Manufacturing Conference*, pp. 400-404 (1998).

Office Action from Patent Application No. JP 2004-515615, dated Mar. 22, 2011.

Office Action dated Dec. 29, 2004, for U.S. Appl. No. 10/393,526.

Response to Office Action dated Dec. 29, 2004, filed Mar. 28, 2005 for U.S. Appl. No. 10/393,526.

Final Office Action dated Jul. 5, 2005, for U.S. Appl. No. 10/393,526.

Response to Office Action dated Jul. 5, 2005, filed Sep. 1, 2005 for U.S. Appl. No. 10/393,526.

Non-Final Office Action dated May 9, 2006, for U.S. Appl. No. 10/393,526.

Response to Office Action dated May 9, 2006, filed Aug. 9, 2006 for U.S. Appl. No. 10/393,526.

Non-Final Office Action dated Apr. 24, 2007, for U.S. Appl. No. 11/652,707.

Response to Office Action dated Apr. 24, 2007, filed Aug. 16, 2007 for U.S. Appl. No. 11/652,707.

Non-Final Office Action dated Oct. 19, 2007, for U.S. Appl. No. 11/652,707.

Response to Office Action dated Oct. 19, 2007, filed Jan. 17, 2008 for U.S. Appl. No. 11/652,707.

Final Office Action dated May 2, 2008, for U.S. Appl. No. 11/652,707.

Response to Office Action dated May 2, 2008, filed Aug. 1, 2008 for U.S. Appl. No. 11/652,707.

Response to Office Action dated May 2, 2008, filed Apr. 3, 2009 for U.S. Appl. No. 11/652,707.

Non-Final Office Action dated Jun. 22, 2009, for U.S. Appl. No. 11/652,707.

Response to Office Action dated Jun. 22, 2009, filed Sep. 22, 2009 for U.S. Appl. No. 11/652,707.

Non-Final Office Action dated Nov. 3, 2011, for U.S. Appl. No. 12/724,194.

(56) References Cited

OTHER PUBLICATIONS

Response to Office Action dated Nov. 3, 2011, filed Feb. 3, 2012 for U.S. Appl. No. 12/724,194.
English Translation of Japanese office action from Japanese application No. 2011-115010 dated Nov. 11, 2013 (7 pages).
English Translation of Japanese office action from Japanese application No. 2011-231707 dated Nov. 11, 2013 (6 pages).
USPTO, Patent Trial and Appeal Board, *Daifuku Co., LTD and Daifuku America Corp.*, Petitioner, v. *Murata Machinery, Ltd.*, Patent Owner, Case IPR2015-00087, U.S. Pat. No. 7,165,927, Oct. 17, 2014 (664 pages).
USPTO, Patent Trial and Appeal Board, *Daifuku Co., LTD and Daifuku America Corp.*, Petitioner, v. *Murata Machinery, Ltd.*, Patent Owner, Case IPR2015-00088, U.S. Pat. No. 7,165,927, Oct. 17, 2014 (671 pages).
USPTO, Patent Trial and Appeal Board, *Daifuku Co., LTD and Daifuku America Corp.*, Petitioner, v. *Murata Machinery, Ltd.*, Patent Owner, Case IPR2015-00085, U.S. Pat. No. 7,771,153, Oct. 17, 2014 (643 pages).
USPTO, Patent Trial and Appeal Board, *Daifuku Co., LTD and Daifuku America Corp.*, Petitioner, v. *Murata Machinery, Ltd.*, Patent Owner, Case IPR2015-00084, U.S. Pat. No. 7,771,153, Oct. 17, 2014 (632 pages).
Declaration of Dr. Robert Sturges Regarding Patentability of U.S. Pat. No. 7,165,927, Oct. 14, Petition for Inter Partes Review of U.S. Pat. No. 8,457,228 (146 pages).
European Communication dated Jul. 16, 2014 from European application No. 03761012.8 (5 pages).
The $2^{nd}$ Preliminary Statement of a Defendant, *Murata Machinery, Ltd.* V *Daifuku Co., Ltd.*, Japanese Patent No. 4831521, No. 10253, Jun. 18, 2015 (12 pages).
Court Decision, *Murata Machinery, Ltd.* vs *Patent Office Commissioner Hitoshi Ito*, Certified in State of New York, Judgement Rendered May 27, 2015, Court Clerk 2014 (Gyo-Ke) No. 10149, Case of Request to Overturn Trial Decision, Appeal Case No. 2013-7294 (114 pages).
Court Decision, *Murata Machinery, Ltd.* vs *Patent Office Commissioner Hitoshi Ito*, Certified in State of New York, Judgement Rendered May 27, 2015, Court Clerk 2014 (Gyo-Ke) No. 10150, Case of Request to Overturn Trial Decision, Appeal Case No. 2013-7295 (92 pages).
Judgment, *Murata Machinery, Ltd.* vs *Daifuku Co., Ltd.*, Certified in State of New York, Rendition of Judgment Jul. 9, 2015, Court Clerk 2014, (Gyo Ke) No. 10253, Request to annul trial decision, Japanese Patent No. 4831521 (150 pages).
Non Final Office action issued in U.S. Appl. No. 14/788,464 dated Aug. 17, 2015.
USPTO Non Final Office Action in U.S. Appl. No. 10/682,809, dated Jun. 4, 2015, 10 pages.
Description of Evidence (3), *Murata Machinery, Ltd.* V. *Daifuku Co., Ltd.*, Invalidity No. 2012-800048, Apr. 1, 2015 (2 pages).
Description of Evidence (4), *Murata Machinery, Ltd.* V. *Daifuku Co., Ltd.*, Invalidity No. 2012-800048, Japanese Patent No. 48315241, May 28, 2015 (2 pages).
Judgment, the shell No. 25 certificate, *Murata Machinery, Ltd.* V. *Daifuku Co., Ltd.*, Invalidity No. 2012-800048, May 27, 2015 (56 pages).
Judgment, the shell No. 26 certificate, *Murata Machinery, Ltd.* V. *Daifuku Co., Ltd.*, Invalidity No. 2012-800048, May 27, 2015 (46 pages).
Plaintiff Preliminary Statement (3), *Murata Machinery, Ltd.* V. *Daifuku Co., Ltd.*, Apr. 1, 2015 (34 pages).
The $1^{st}$ Preliminary Statement of a defendant, *Murata Machinery, Ltd.* V. *Daifuku Co., Ltd.*, Mar. 2, 2015 (33 pages).
Decision Denying Institution of Inter Partes Review 37 C.F.R. §42.108, *Murata Machinery, Ltd.* V. *Daifuku Co., Ltd.*, May 4, 2015 (18 pages).
Description of Evidence (5), *Murata Machinery, Ltd.* V. *Daifuku Co., Ltd.*, Invalidity No. 2012-800048, Japanese Patent No. 48315241, Jun. 10, 2015 (2 pages).

Technical Explanation Data, Evidence No. 27, *Murata Machinery, Ltd.* V. *Daifuku Co., Ltd.*, Invalidity No. 2012-800048, Japanese Patent No. 48315241, Jun. 10, 2015 (12 pages).
Written Statement, *Murata Machinery, Ltd.* V. *Daifuku Co., Ltd.*, Invalidity No. 2012-800048, Japanese Patent No. 48315241, Jun. 10, 2015 (1 page).
Judgement, *Murata Machinery, Ltd.* V *Daifuku Co., Ltd.*, Japanese Patent No. 4831521, No. 10253, Invalidity No. 800061, Jun. 25, 2015 (57 pages).
Non Final Office action issued in U.S. Appl. No. 14/080,590 dated Sep. 23, 2015.
Non Final Office action issued in U.S. Appl. No. 14/755,928 dated Oct. 16, 2015.
Non Final Office action issued in U.S. Appl. No. 14/788,173 dated Oct. 15, 2015.
The Trial Decision, *Murata Machinery, Ltd.* V *Daifuku Co., Ltd.*, Dispatch No. 105297, Invalidity 2013-800061, Japanese Patent No. 4831521, No. 10253, Jan. 7, 2016 (42 pages).
European Communication issued in European application 13162984.2 dated Feb. 2, 2015 (24 pages).
Final Written Decision, *Daifuku Co., Ltd. and Daifuku America Corp.* v *Murata Machinery, Ltd.*, Case IPR2015-00088, U.S. Pat. No. 7,165,927B2, May 3, 2016 (27 pages).
Decision: Final Written Decision, *Daifuku Co., Ltd. and Daifuku America Corp.* v *Murata Machinery, Ltd.*, Case IPR2015-00085, U.S. Pat. No. 7,771,153B2, May 3, 2016 (32 pages).
Record of Oral Hearing, *Daifuku Co., Ltd. and Daifuku America Corp.* v *Murata Machinery, Ltd.*, Case No. IPR2015-00083 (U.S. Pat. No. 8,197,172), Case No. IPR2015-00085 (U.S. Pat. No. 7,771,153), Case No. IPR2015-00088 (U.S. Pat. No. 7,165,927), Mar. 8, 2016 (90 pages).
Non Final office action from U.S. Appl. No. 14/755,928 dated Apr. 13, 2016.
Final office action from U.S. Appl. No. 14/080,590 dated Apr. 27, 2016.
Notice of allowance from U.S. Appl. No. 14/788,173 dated Apr. 19, 2016.
Final office action from U.S. Appl. No. 14/788,464 dated Feb. 18, 2016.
Non Final office action from U.S. Appl. No. 10/682,809 dated Jul. 1, 2016.
Notice of allowance from U.S. Appl. No. 14/788,173 dated Aug. 24, 2016.
Notice of allowance from U.S. Appl. No. 14/788,173 dated Oct. 6, 2016.
European communication from EP Application No. 03761012.8 dated Jul. 24, 2017 (5 pages).
Office action issued in Japanese Application No. 2004-543686 dated Jul. 20, 2010.
Search Report from corresponding EP Application No./Patent No. 03 776281.2-2222 / 1573778 PCT/US0332200, dated Sep. 13, 2011.
USPTO, Patent Trial and Appeal Board, *Daifuku Co., Ltd and Daifuku America Corp.*, Petitioner, v. *Murata Machinery, Ltd.*, Patent Owner, Case IPR2015-00083, U.S. Pat. No. 8,197,172, Oct. 17, 2014 (642 pages).
Complaint filed Sep. 23, 2013; *Murata Machinery USA, Inc. et al.* v *Daifuku Co., Ltd. Et al.*, No. 2:13-cv-00866, D. Utah Sep. 23, 2013 (9 pages).
Dictionary.com, retrieved from the Internet, http://dictionary.reference.com/browse/translate?s=t[Oct. 8, 2014 2:45:57 PM], visited Oct. 8, 2014 (8 pages).
Amendment dated Aug. 9, 2006, U.S. Appl. No. 10/393,526 (31 pages).
Notice of Allowance and Notice of Allowability dated Oct. 26, 2006, U.S. Appl. No. 10/393,526 (6 pages).
Office Action dated Nov. 3, 2011, U.S. Appl. No. 12/724,194 (6 pages).
Amendment dated Feb. 3, 2012, U.S. Appl. No. 12/724,194 (18 pages).
Notice of Allowance and Notice of Allowability dated Feb. 28, 2012, U.S. Appl. No. 12/724,194 (9 pages).
Preliminary Amendment dated Mar. 15, 2010, U.S. Appl. No. 12/724,194 (8 pages).

(56) References Cited

OTHER PUBLICATIONS

Original Application Claim 1 dated Jan. 12, 2007, U.S. Appl. No. 11/652,707 (34 pages).
Amendment dated Apr. 3, 2009, U.S. Appl. No. 11/652,707 (14 pages).
Amendment dated Sep. 22, 2009, U.S. Appl. No. 11/652,707 (13 pages).
Office Action dated Jun. 22, 2009, U.S. Appl. No. 11/652,707 (6 pages).
Notice of Allowance and Notice of Allowability dated Nov. 18, 2009, U.S. Appl. No. 11/652,707 (6 pages).
Notice of Allowance and Notice of Allowability dated May 5, 2010, U.S. Appl. No. 11/652,707 (6 pages).
Declaration of Dr. Robert Sturges Regarding Patentability of U.S. Pat. No. 7,165,927, Oct. 14, 2014, Petition for Inter Partes Review of U.S. Pat. No. 8,457,228 (146 pages).
Notification of conclusion of appeal examination document, Invalidity 2013-800061, U.S. Pat. No. 4,831,521, Intellectual Property High Court of Japan, Oct. 2, 2014 (17 pages).
Trial Decision, Invalidity 2013-800061, U.S. Pat. No. 4,831,521, Intellectual Property High Court of Japan, Oct. 23, 2014 (35 pages).
Complaint, Invalidity 2013-800061, U.S. Pat. No. 4,831,521, Intellectual Property High Court of Japan, Nov. 19, 2014 (5 pages).

\* cited by examiner

AUTOMATED MATERIAL HANDLING SYSTEM FOR SEMICONDUCTOR MANUFACTURING BASED ON A COMBINATION OF VERTICAL CAROUSELS AND OVERHEAD HOISTS

CLAIM OF PRIORITY

This application is a continuation of and claims priority under 35 U.S.C. § 120 to U.S. patent application Ser. No. 12/724,194, filed Mar. 15, 2010, which issued as U.S. Pat. No. 8,197,172 and is entitled "AUTOMATED MATERIAL HANDLING SYSTEM FOR SEMICONDUCTOR MANUFACTURING BASED ON A COMBINATION OF VERTICAL CAROUSELS AND OVERHEAD HOISTS, which is a continuation of and claims priority under 35 U.S.C. § 120 to U.S. patent application Ser. No. 11/652,707, filed Jan. 12, 2007 now U.S. Pat. No. 7,771,153 and entitled "AUTOMATED MATERIAL HANDLING SYSTEM FOR SEMICONDUCTOR MANUFACTURING BASED ON A COMBINATION OF VERTICAL CAROUSELS AND OVERHEAD HOISTS," which is a continuation of and claims priority under 35 U.S.C. § 120 to U.S. patent application Ser. No. 10/393,526, filed Mar. 20, 2003 now U.S. Pat. No. 7,165,927 and entitled "AUTOMATED MATERIAL HANDLING SYSTEM FOR SEMICONDUCTOR MANUFACTURING BASED ON A COMBINATION OF VERTICAL CAROUSELS AND OVERHEAD HOISTS," which claims priority under 35 U.S.C. § 119(e) to U.S. Provisional Patent Application No. 60/389,993, filed Jun. 19, 2002 and entitled "AUTOMATED MATERIAL HANDLING SYSTEM FOR SEMICONDUCTOR MANUFACTURING BASED ON A COMBINATION OF VERTICAL CAROUSELS AND OVERHEAD HOISTS," and U.S. Provisional Patent Application No. 60/417,993, filed Oct. 11, 2002 and entitled "OFFSET ZERO FOOTPRINT STORAGE (ZFS) USING MOVING SHELVES OR A TRANSLATING HOIST PLATFORM," the entire contents of each of which are hereby incorporated by reference.

BACKGROUND OF THE INVENTION

The present invention relates generally to automated material handling systems, and more specifically to an automated material handling system that allows an overhead hoist to access work-in-process (WIP) parts directly from a WIP storage unit to increase the efficiency of the overall material handling system.

Automated material handling systems are known that employ WIP storage units and overhead hoists to store and transport WIP parts between various workstations and/or processing machines in a product manufacturing environment. For example, such an Automated Material Handling System (AMHS) is commonly employed in the manufacturing of Integrated Circuit (IC) chips. A typical process for fabricating an IC chip comprises various steps including deposition, cleaning, ion implantation, etching, and passivation steps. Further, each of these steps in the IC chip fabrication process is usually performed by a different processing machine such as a chemical vapor deposition chamber, an ion implantation chamber, or an etcher. Accordingly, the WIP parts, e.g., semiconductor wafers, are typically transported between the different workstations and/or processing machines multiple times to perform the various process steps required for fabricating the IC chips.

A conventional AMHS for manufacturing IC chips comprises a plurality of WIP storage units (also known as "stockers") for storing the semiconductor wafers, and one or more overhead hoist transport vehicles for transporting the wafers between the various workstations and processing machines on the IC chip manufacturing floor. The semiconductor wafers stored in the WIP stockers are typically loaded into cassette pods such as Front Opening Unified Pods (FOUPs), which are subsequently transferred to an overhead transport vehicle configured to travel on a suspended track. In the conventional AMHS, each stocker is typically provided with a plurality of active input/output ports that work in conjunction with an internal robotic arm (which may provide up to three or more axes of movement) for loading and unloading the FOUPs to/from the stocker. The FOUPs are picked and placed from/to the input/output ports by the overhead hoist vehicle.

One drawback of the conventional AMHS is that the efficiency of the overall system is limited by the time required for the robotic arm to access the FOUPs at the WIP stocker's active input/output ports. Because of the generally delicate nature of the semiconductor wafers, strict limits are normally imposed on the acceleration rate of the robotic arm. For this reason, a minimum amount of time is typically required for moving the FOUPs to and from the stocker's input/output ports. This minimum move time generally determines the stocker throughput, which dictates the number of stockers needed to support the desired IC chip production level and thus the total cost of the AMES. Although the material handling efficiency of the AMHS might be improved by increasing the number of active input/output ports on each stocker and by allowing the overhead transport vehicle to access multiple input/output ports simultaneously, providing additional input/output ports can significantly increase the cost of the stocker.

In addition, the combination of a three or more axis internal robot in the stocker with several input/output ports, each having 1-3 axes of motion, means that a typical stocker may have between 5 and 16 axes of motion. This is a very complex, low reliability, and costly solution for storing material.

It would therefore be desirable to have an automated material handling system that provides enhanced material handling efficiency while overcoming the drawbacks of conventional automated material handling systems.

BRIEF SUMMARY OF THE INVENTION

In accordance with the present invention, a highly efficient Automated Material Handling System (AMHS) is provided that allows an overhead hoist to load and unload Work-In-Process (WIP) parts directly to/from one or more WIP storage units included in the system.

In one embodiment, the improved AMHS comprises an overhead hoist transport subsystem and at least one vertical carousel WIP storage unit ("stocker") including a plurality of storage bins. The overhead hoist transport subsystem includes at least one overhead hoist transport vehicle configured to travel along a suspended track defining at least one predetermined route. The predetermined route passes over the vertical carousel stocker, which is configured to allow the overhead hoist to access one or more WIP parts directly from a selected one of the carousel storage bins. In this first embodiment, the selected carousel storage bin containing the desired WIP lot(s) is positioned at the top of the vertical carousel stocker substantially directly underneath the suspended track. Next, the overhead hoist transport vehicle is moved along the suspended track to a position substantially directly above the selected carousel storage bin. The overhead hoist is then lowered toward the selected storage bin. Finally, the overhead hoist is operated to pick the desired WIP lot directly from the carousel storage bin, or to place one or more WIP lots in the carousel storage bin.

In a second embodiment, the predetermined route defined by the suspended track passes parallel to the vertical carousel WIP stocker, which is configured to allow the overhead hoist to access one or more WIP parts directly from one of the carousel storage bins. The AMHS further includes an extraction mechanism, which works in conjunction with the vertical carousel stocker to suitably position the selected carousel storage bin containing the desired WIP lot(s) relative to the track. For example, the extraction mechanism may be configured to move the selected carousel storage bin (e.g., a movable shelf) along a single servo-controlled axis from a first position adjacent the track to a second position substantially directly underneath the track. In the second embodiment, the overhead transport vehicle is moved along the track to a position substantially directly above the second position. Next, the overhead hoist is lowered toward the second position. In an alternative embodiment, the selected carousel storage bin comprises a shelf positioned alongside the track, and the overhead hoist is mounted to a translating stage for picking and placing one or more WIP lots to the shelf at the side of the overhead transport vehicle. Finally, the overhead hoist is operated to pick the desired WIP lot directly from the selected storage bin, or to place one or more WIP lots in the selected storage bin.

By configuring the AMHS to allow the overhead hoist to directly load and unload WIP parts to/from the carousel storage bins from a position above the respective storage bin, more efficient AMHS operation can be achieved.

Other features, functions, and aspects of the invention will be evident from the Detailed Description of the Invention that follows.

BRIEF DESCRIPTION OF THE SEVERAL VIEWS OF THE DRAWING

The invention will be more fully understood with reference to the following Detailed Description of the Invention in conjunction with the drawings of which.

DETAILED DESCRIPTION OF THE INVENTION

The entire disclosures of U.S. patent application Ser. No. 10/393,526 filed Mar. 20, 2003 entitled AUTOMATED MATERIAL HANDLING SYSTEM FOR SEMICONDUCTOR MANUFACTURING BASED ON A COMBINATION OF VERTICAL CAROUSELS AND OVERHEAD HOISTS, U.S. Provisional Patent Application No. 60/389,993 filed Jun. 19, 2002 entitled AUTOMATED MATERIAL HANDLING SYSTEM FOR SEMICONDUCTOR MANUFACTURING BASED ON A COMBINATION OF VERTICAL CAROUSELS AND OVERHEAD HOISTS, and U.S. Provisional Patent Application No. 60/417,993 filed Oct. 11, 2002 entitled OFFSET ZERO FOOTPRINT STORAGE (ZFS) USING MOVING SHELVES OR A TRANSLATING HOIST PLATFORM, are incorporated herein by reference.

An Automated Material Handling System (AMHS) is disclosed that can load and unload Work-In-Process (WIP) parts to/from a WIP storage unit with increased efficiency. The presently disclosed AMHS achieves such increased material handling efficiency by allowing top-loading/unloading of storage bins in a vertical carousel WIP storage unit by an overhead hoist positioned above the respective storage bin.

Figure 1:
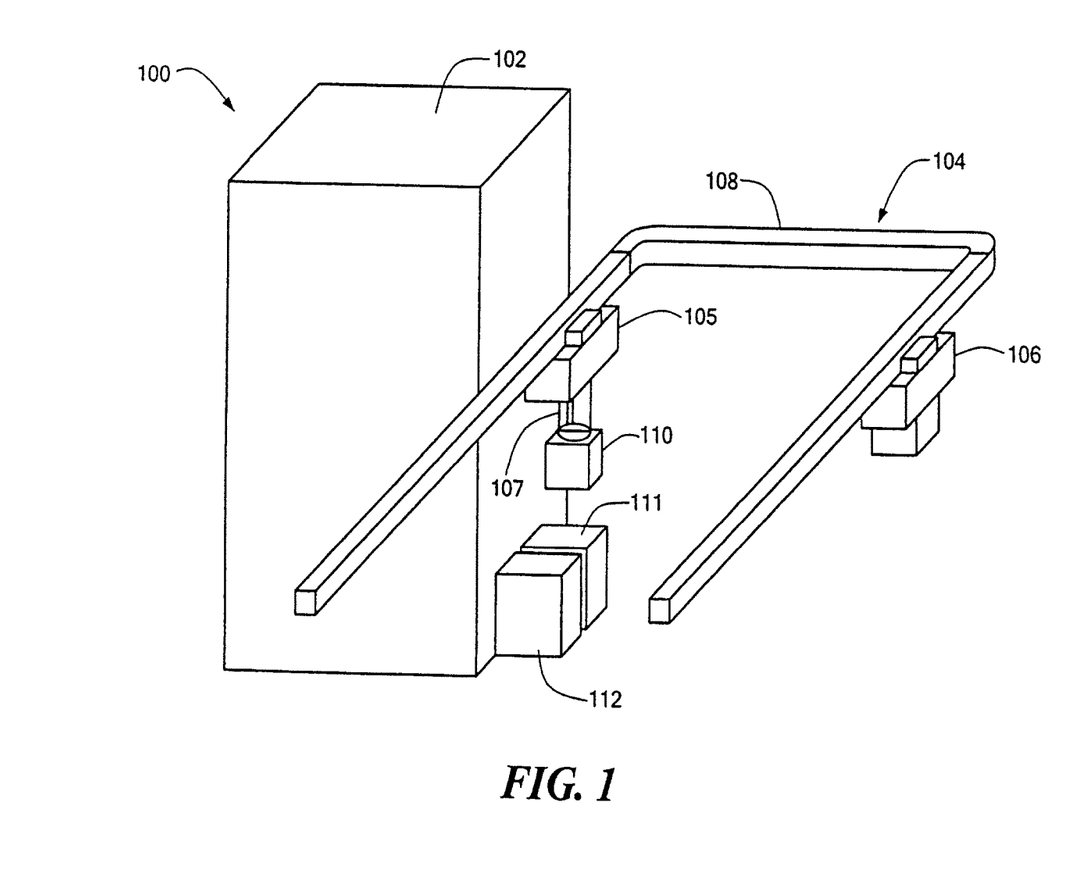
FIG. 1 is a perspective view of a conventional automated material handling system.

FIG. 1 depicts a conventional AMHS 100, which may be employed to automatically store and transport WIP parts between various workstations and/or processing machines in a product manufacturing environment, e.g., a clean environment for manufacturing Integrated Circuit (IC) chips. As shown in FIG. 1, the conventional AMHS 100 comprises a WIP storage unit ("stocker") 102 and an overhead hoist transport subsystem 104. The WIP stocker 102 includes input and output ports 111-112, and the overhead hoist transport subsystem 104 includes a suspended track 108 and a plurality of overhead hoist transport vehicles 105-106 configured to travel on the track 108. In a typical mode of operation, the WIP parts are transported in a cassette pod 110 such as a Front Opening Unified Pod (FOUP). The first overhead transport vehicle 105 travels along the track 108 and stops at a position suitable for unloading the FOUP 110 into the input port 111 or for loading another FOUP from the output port 112 of the stocker 102. Further, the second overhead transport vehicle 106 waits on the track 108 until the first overhead transport vehicle 105 finishes unloading/loading the FOUP and moves out of the way.

In the conventional AMHS 100, FOUPs are unloaded from the overhead hoist into the input port 111, loaded from the output port 112 into the overhead hoist, or otherwise accessed from within the stocker 102 by a robotic arm 107, which may provide up to three or more axes of movement. Further, the minimum amount of time required to access the FOUPs from the stocker 102 generally determines the stocker throughput, which dictates the number of stockers needed to support the desired production level. Accordingly, complex movements of the multi-axis robotic arm 107 for accessing the FOUPs may cause the minimum move time to increase, thereby increasing both the number of stockers needed in the AMHS 100 and the overall cost of the material handling system.

Figure 2:
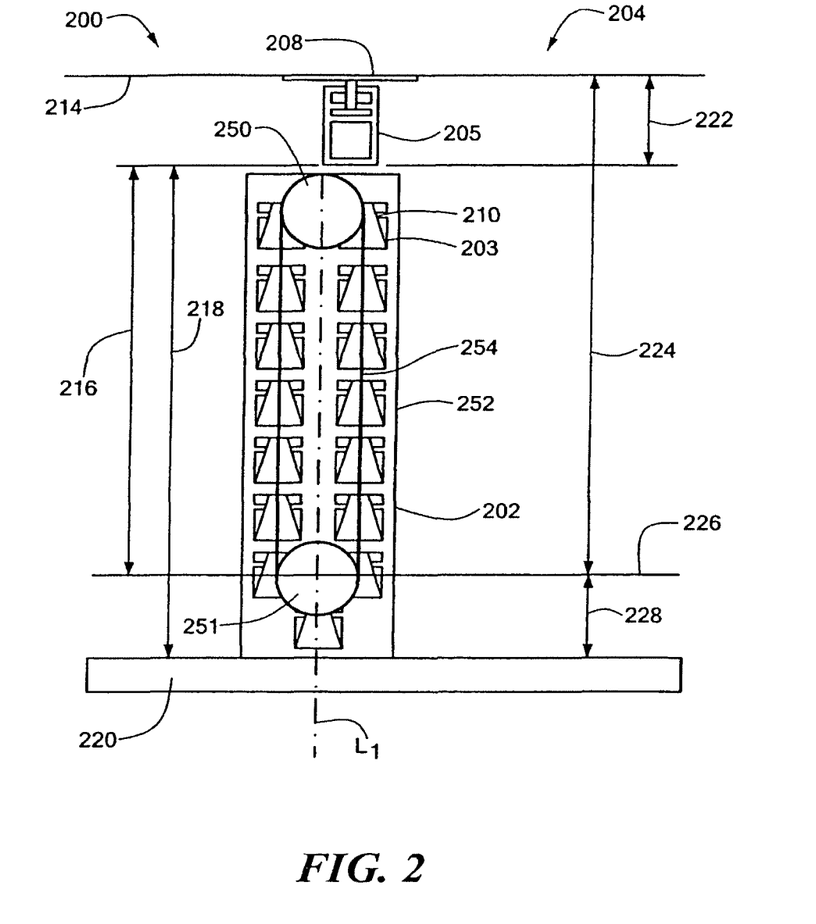
FIG. 2 is block diagram of a first embodiment of an automated material handling system according to the present invention.

FIG. 2 depicts an illustrative embodiment of an Automated Material Handling System (AMHS) 200, in accordance with the present invention. In the illustrated embodiment, the AMHS 200 comprises an overhead hoist transport subsystem 204, and at least one vertical carousel WIP storage unit ("stocker") 202 including a plurality of storage bins such as a carousel storage bin 203. The vertical carousel WIP stocker 202 is configured to allow an overhead hoist in the overhead hoist transport subsystem 204 to access WIP parts directly from a selected one of the carousel storage bins.

It is noted that like the conventional AMHS 100 (see FIG. 1), the AMHS 200 of FIG. 2 may be employed in a clean environment for manufacturing IC chips such as a 200 mm or 300 mm FAB plant, or any other suitable product manufacturing environment. As shown in FIG. 2, the IC chip manufacturing environment includes first and second floors 220 and 226, and a ceiling 214. The first floor 220 typically comprises a waffle slab made of reinforced concrete, and the second floor 226 comprises a raised floor located above the waffle slab 220. The vertical carousel stocker 202 is positioned on the waffle slab 220. Further, workstations and/or processing machines (not shown) configured to perform various process steps for fabricating the IC chips are positioned on the raised floor 226, which is typically covered with an electrically nonconductive material and designed to meet specific loading and seismic requirements. For example, the raised floor 226 may be located a distance 228 (about 0.6 m) above the waffle slab 220 and a distance 224 (greater than or equal to about 4.15 m) below the ceiling 214.

In the presently disclosed embodiment, the vertical carousel stocker 202 includes a housing 252, and first and second pulleys 250-251 and a belt 254 disposed within the housing 252. As shown in FIG. 2, the carousel storage bins (e.g., the storage bin 203) are coupled to the belt 254 at various spaced locations along the belt, and the belt 254 is looped between the first and second pulleys 250-251 to allow the storage bins to be rotatably positioned along the belt path by driving one of the pulleys 250-251. For example, the vertical carousel stocker 202 may have a height 218 (about 3.85 m). The top of the vertical carousel stocker 202 may therefore be a distance 216 (about 3.25 m) above the raised floor 226.

As described above, the vertical carousel stocker 202 is configured to allow an overhead hoist to access WIP parts, e.g., semiconductor wafers, directly from one of the carousel storage bins. In the illustrated embodiment, the portion of the stocker housing 252 near the ceiling 214 is at least partially open to allow top-loading/unloading of the selected carousel storage bin. Further, each carousel storage bin comprises a fixed shelf, and the semiconductor wafers are loaded into cassette pods such as a Front Opening Unified Pod (FOUP) 210 disposed on the shelf 203. For example, each FOUP 210 may hold one or more semiconductor wafer lots, thereby allowing the overhead hoist to access multiple wafer lots in a single carousel storage bin simultaneously.

The overhead hoist transport subsystem 204 includes a suspended track 208 and at least one overhead hoist transport vehicle 205 configured for traveling on the track 208. The suspended track 208 defines at least one predetermined route passing over the vertical carousel stocker 202, thereby allowing the overhead transport vehicle 205 to access a FOUP directly from one of the carousel storage bins positioned approximately at the top of the stocker 202. For example, the overhead transport vehicle 205 may extend a distance 222 (about 0.9 m) from the ceiling 214.

In an illustrative mode of operation, the selected carousel storage bin, e.g., the storage bin 203 containing the FOUP 210, is positioned approximately at the top of the vertical carousel stocker 202 underneath the track 208. The overhead transport vehicle 205 is then moved along the track 208 to a position substantially directly above the storage bin 203. Next, the overhead hoist is lowered from the overhead transport vehicle 205 through the opening in the stocker housing 252 toward the storage bin 203. For example, the overhead hoist may be lowered in a direction parallel to the longitudinal axis $L_1$ of the stocker. The overhead hoist is then operated to pick the FOUP 210 directly from the storage bin 203 for subsequent transport to a workstation or processing machine on the IC chip manufacturing floor. It is understood that the overhead hoist may alternatively be operated to place a FOUP in the carousel storage bin 203.

Figure 3:
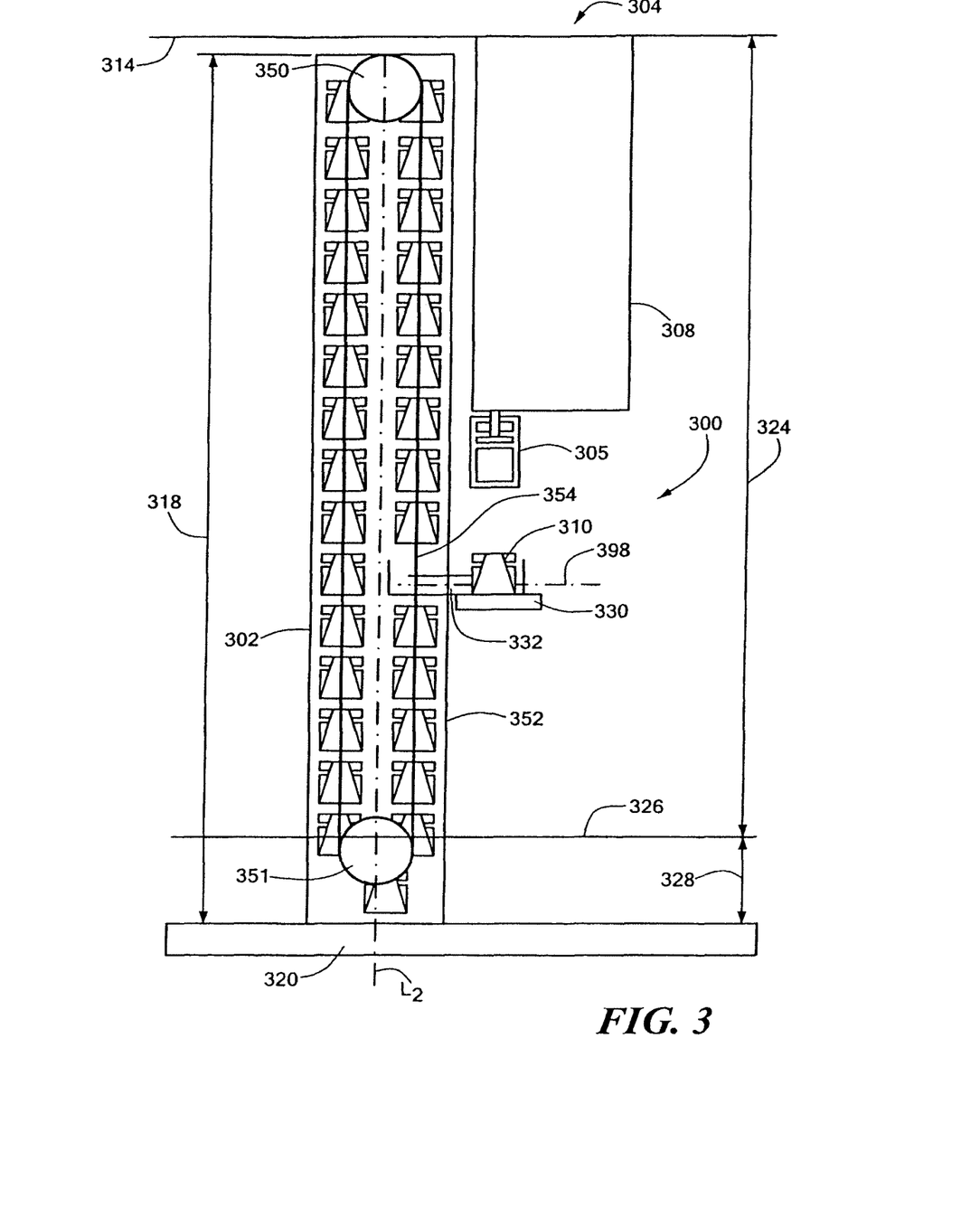
FIG. 3 is a block diagram of a second embodiment of the automated material handling system of FIG. 2.

FIG. 3 depicts an alternative embodiment 300 of the AMHS 200 (see FIG. 2). As shown in FIG. 3, the AMHS 300 comprises an overhead hoist transport system 304, and at least one vertical carousel WIP stocker 302 including a plurality of storage bins such as a slide-mounted storage bin 332. Like the vertical carousel stocker 202, the vertical carousel stocker 302 is configured to allow an overhead hoist in the overhead hoist transport system 304 to access WIP parts, e.g., semiconductor wafers, directly from a selected one of the carousel storage bins.

Specifically, the AMHS 300 may be employed in an IC chip manufacturing environment including a ceiling 314, a waffle slab 320, and a raised floor 326 located above the waffle slab 320. As shown in FIG. 3, the vertical carousel stocker 302 is positioned on the waffle slab 320. For example, the raised floor 326 may be located a distance 328 (about 0.6 m) above the waffle slab 320 and a distance 324 (greater than about 5.4 m) below the ceiling 314. Further, the vertical carousel stocker 302 includes a housing 352, and first and second pulleys 350-351 and a belt 354 disposed within the housing 352. The carousel storage bins (e.g., the slide-mounted storage bin 332) are coupleable to the belt 354 at various spaced locations along the belt, and the belt 354 is looped between the first and second pulleys 350-351 to allow the storage bins to be rotatably positioned along the belt path by driving one of the pulleys 350-351. For example, the vertical carousel stocker 302 may have a height 318 (about 6 m).

As described above, the vertical carousel stocker 302 is configured to allow an overhead hoist to access the semiconductor wafers directly from one of the carousel storage bins. In the illustrated embodiment, at least one side of the housing 352 is at least partially open to allow the selected carousel storage bin to be extracted from within the housing 352, and to allow subsequent top-loading/unloading of the selected storage bin by the overhead hoist. Specifically, the AMHS 300 further includes at least one extraction mechanism 330, which works to extract the semiconductor wafers from within the stocker 302, and to suitably position the material relative to a suspended track 308 included in the overhead hoist transport subsystem 304. It is noted that each storage bin may comprise either a movable or fixed shelf. Further, the semiconductor wafers are loaded into cassette pods such as a FOUP 310 disposed on the shelf 332.

The overhead hoist transport subsystem 304 includes the suspended track 308 and at least one overhead hoist transport vehicle 305 configured to travel on the track 308. The track 308 defines at least one predetermined route passing parallel to the vertical carousel stocker 302, thereby allowing the overhead transport vehicle 305 to access a FOUP directly from a selected one of the slide-mounted storage bins.

In an illustrative mode of operation, the selected slide-mounted storage bin, e.g., the storage bin 332 containing the FOUP 310, is positioned to allow the extraction mechanism 330 to extract the storage bin 332 from within the stocker 302 and to position the storage bin 332 directly underneath the track 308. It is noted that the extraction mechanism 330 may be incorporated into the stocker 302 and configured to move the storage bin 332 along a single servo-controlled axis 398. The overhead transport vehicle 305 is then moved along the track 308 to a position directly above the extracted storage bin 332. Next, the overhead hoist is lowered from the overhead transport vehicle 305 toward the storage bin 332, e.g., in a direction parallel to the longitudinal axis $L_2$ of the stocker. The overhead hoist is then operated to pick the FOUP 310 directly from the storage bin 332 for subsequent transport to a workstation or processing machine on the IC chip manufacturing floor. It is appreciated that the overhead hoist may alternatively be operated to place a FOUP in the carousel storage bin 332.

Figure 4:
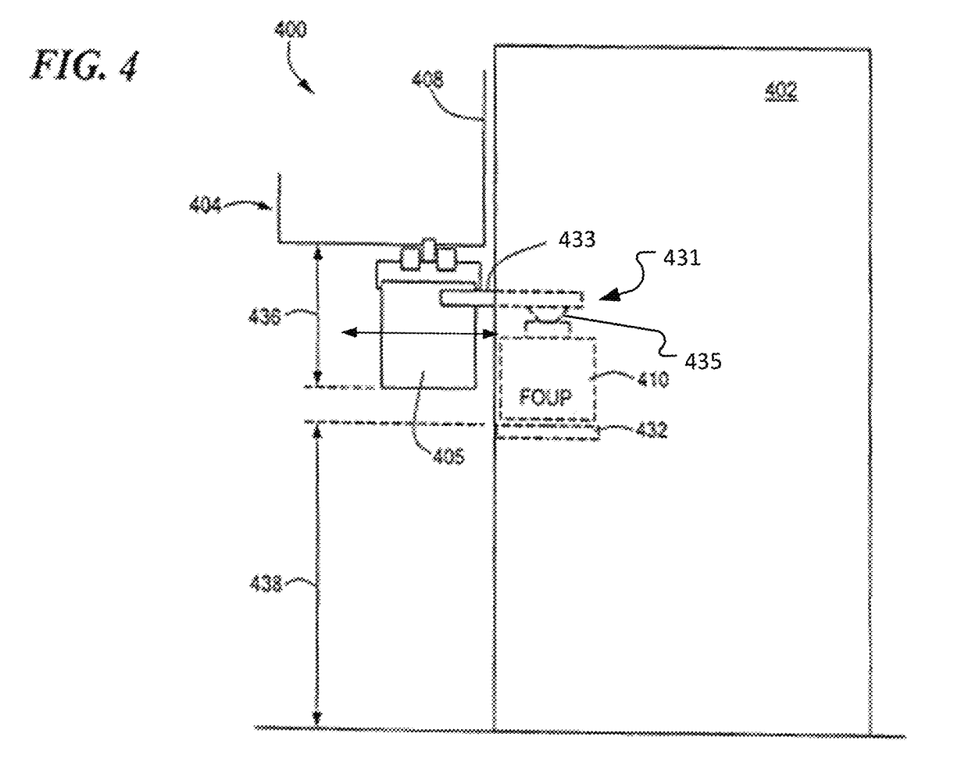
FIG. 4 is a block diagram of a third embodiment of the automated material handling system of FIG. 2.

FIG. 4 depicts a detailed embodiment 400 of the AMHS 300 (see FIG. 3). In the illustrated embodiment, the AMHS 400 comprises an overhead hoist transport system 404 and a vertical carousel stocker 402. The overhead hoist transport system 404 includes a suspended track 408 and an overhead hoist transport vehicle 405 configured for traveling on the track 408. For example, the overhead transport vehicle 405 may extend a distance 436 (about 0.9 m) from the track 408. The vertical carousel stocker 402 includes a plurality of carousel storage bins such as a storage bin 432 disposed within the stocker housing. For example, the storage bin 432 may be a distance 438 (about 2.6 m) above the raised IC chip manufacturing floor.

As described above, a FOUP 410 is extracted from within the stocker housing to allow subsequent top-loading/unloading of the selected storage bin. The overhead transport vehicle 405 further includes an overhead hoist 431 having a gripper 435 configured to top-load/unload the FOUP 410 to/from the storage bin 432. In the preferred embodiment, the hoist gripper 430 is mounted on a translating stage 433 to allow the overhead hoist to pick/place a cassette pod to either side of the overhead transport vehicle 405.

Figure 5A:
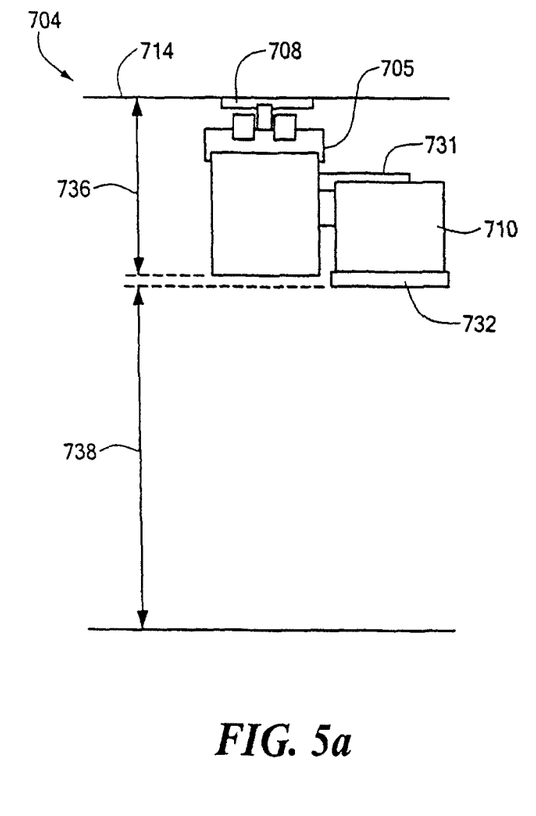
FIGS. 5a-5b are block diagrams of a translating hoist vehicle accessing fixed storage positions according to the present invention.
Figure 5B:
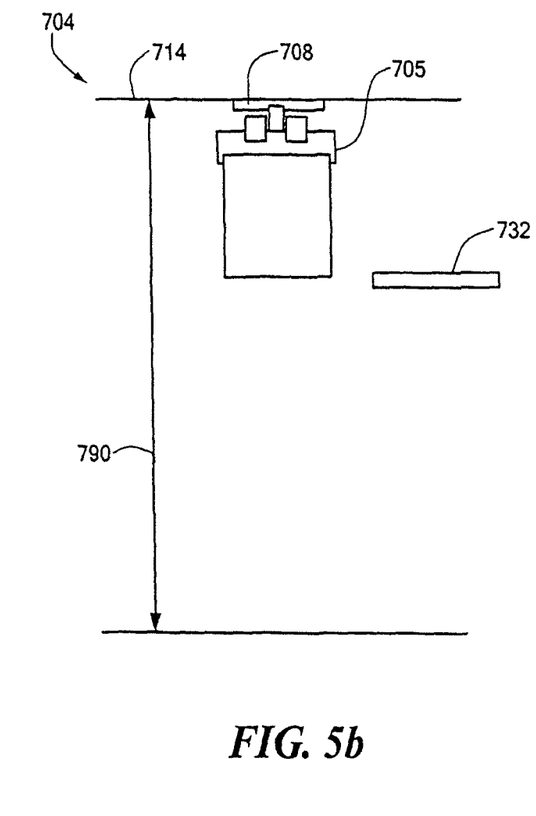

FIGS. 5a-5b depict a translating hoist vehicle subsystem 704 accessing fixed storage positions. In the illustrated embodiment, the translating hoist vehicle subsystem 704 includes a suspended track 708, and an overhead hoist transport vehicle 705 configured to travel on the track. The overhead transport vehicle 705 is configured to pick/place a FOUP 710 to a fixed storage position 732. For example, the overhead transport vehicle 705 may extend a distance 736 (about 0.9 m) below the ceiling 714, and the storage position 732 may be disposed a distance 738 (about 2.6 m) above the raised IC chip manufacturing floor. Further, the ceiling 714 may be a distance 790 (about 3.66 m) above the raised floor.

The overhead transport vehicle 705 is configured to pick (and place) the FOUP 710 to a position located directly below the suspended track 708. To that end, the overhead hoist vehicle 705 includes a hoist gripper 731 mounted to a translating stage and configured to extend from the vehicle 705, pick up the FOUP 710, and retract back to the vehicle 705, thereby moving the FOUP 710 within the overhead transport vehicle 705 (see FIG. 5b). In the preferred embodiment, the translating stage is configured to allow the overhead hoist to pick/place a cassette pod to either side of the overhead transport vehicle 705. Once the FOUP 710 is held by the hoist gripper 730, the overhead transport vehicle 705 transports it to a workstation or processing machine on the IC chip manufacturing floor.

Figure 6:
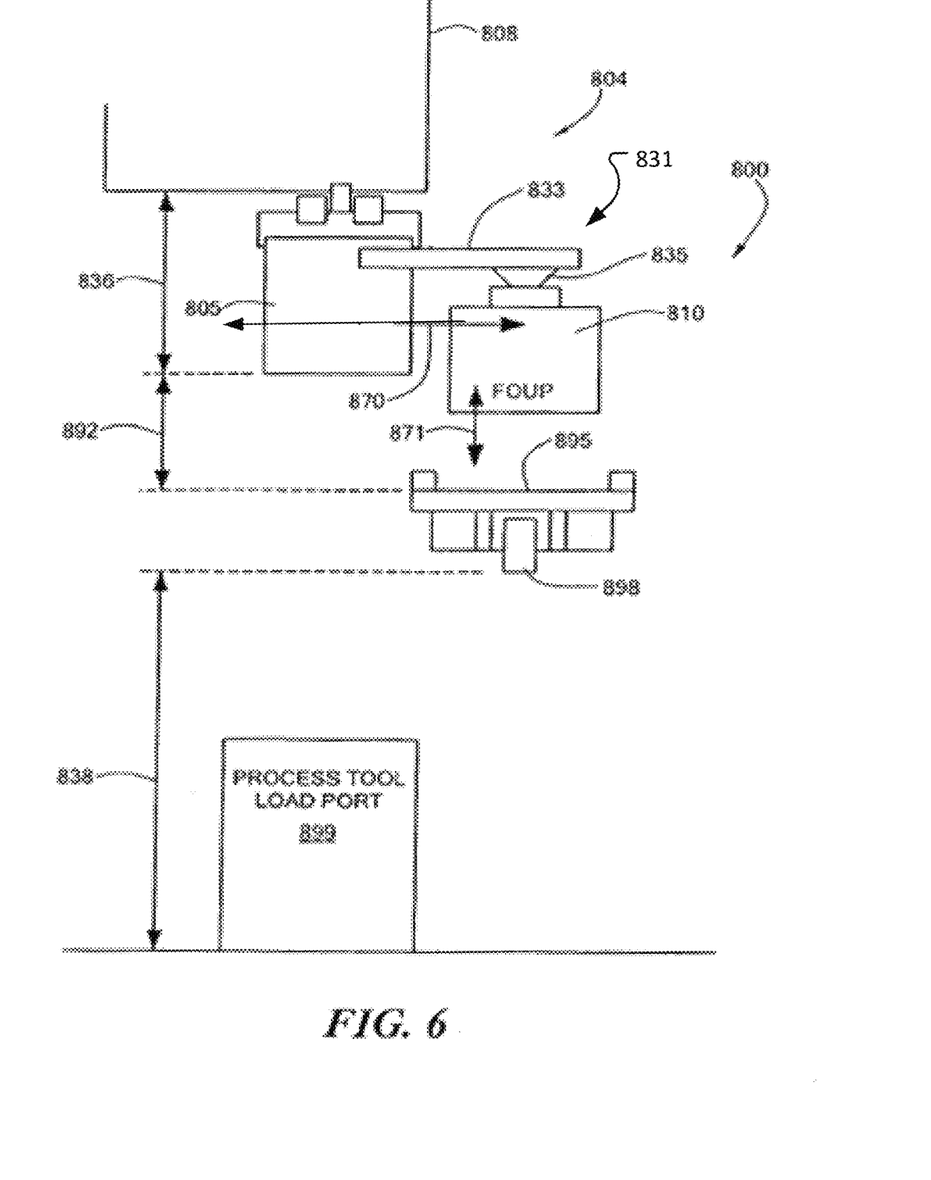
FIG. 6 is a block diagram of the translating hoist vehicle of FIGS. 5a-5b accessing material on a conveyer.

FIG. 6 depicts a translating hoist vehicle system 800 accessing material either stored or moving on a conveyer 895. Specifically, an overhead hoist transport subsystem 804 is employed to directly pick or place a FOUP 810 to the overhead rail-based conveyer 895. In the illustrated embodiment, the overhead hoist transport subsystem 804 includes a suspended track 808 and an overhead hoist transport vehicle 805 configured to travel on the track 808. For example, the overhead transport vehicle 805 may extend a distance 836 (about 0.9 m) below the track 808 and be disposed a distance 892 (about 0.35 m) above the rail-based conveyer 895. Further, the overhead rail 898 may be a distance 838 (about 2.6 m) above the raised IC manufacturing floor. It should be understood that the rail 898 extends in a direction perpendicular to the plane of the drawing. The translating hoist vehicle system 800 further includes a process tool load port 899.

The overhead transport vehicle 805 may be employed to perform top-loading/unloading of the rail-based conveyer 895. To that end, the overhead transport vehicle 805 includes an overhead hoist 831 having a hoist gripper 835, which is mounted to a translating stage 833 configured to allow both horizontal and vertical motion, as indicated by the directional arrows 870 and 871, respectively. In an illustrative mode of operation, the rail-based conveyer 895 is moved so that the FOUP 810 is positioned directly underneath the overhead hoist 831. The hoist gripper 835 is then lowered via the translating stage 833 toward the FOUP 810, and operated to pick the FOUP 810 directly from the conveyer 895. Next, the hoist gripper 835 carrying the FOUP 810 is raised and retracted via the translating stage 833, thereby moving the FOUP 810 within the overhead transport vehicle 805. The transport vehicle 805 then transports the FOUP 810 to a workstation or processing machine on the IC chip manufacturing floor.

Figure 7:
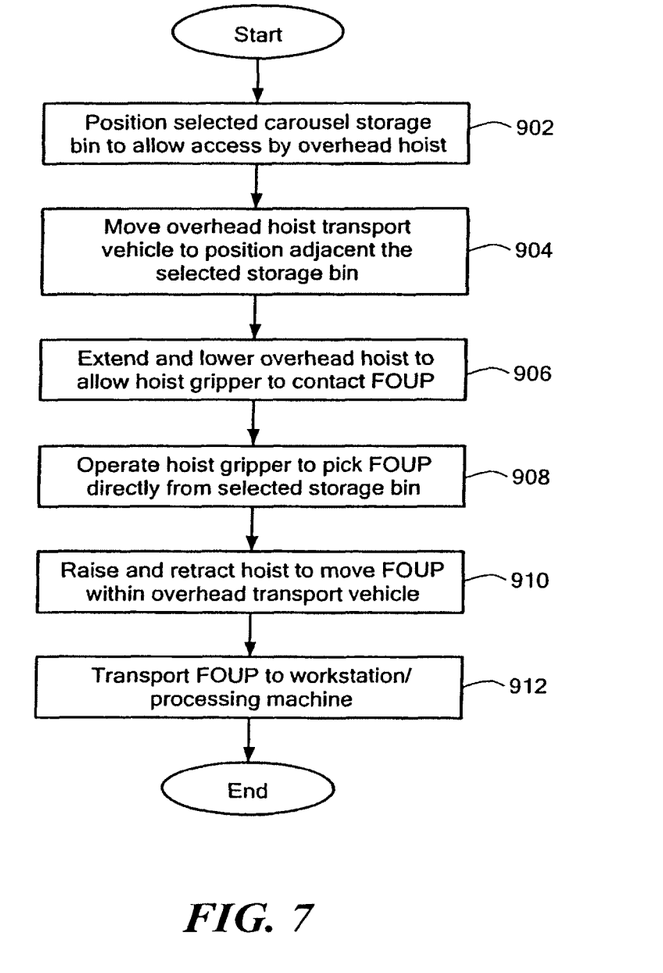
FIG. 7 is a flow diagram of a method of operating the automated material handling system of FIG. 2.

A method of operating the presently disclosed automated material handling system is illustrated by reference to FIG. 7. As depicted in step 902, a selected storage bin containing a FOUP is positioned within a vertical carousel stocker to allow access by an overhead hoist. For example, the selected carousel storage bin may be positioned at the top or at the side of the vertical carousel stocker (see FIGS. 2-3). Next, the overhead hoist transport vehicle is moved along a track, as depicted in step 904, to a position adjacent the selected storage bin. In the event the selected storage bin is positioned at the top of the stocker, the overhead transport vehicle is positioned above the storage bin. In the event the selected storage bin is positioned at the side of the stocker, the overhead transport vehicle is positioned to the side of the storage bin. The overhead hoist is then extended from the transport vehicle and lowered, as depicted in step 906, to allow the hoist gripper to contact the FOUP in the selected storage bin. Next, the hoist gripper is operated, as depicted in step 908, to pick the FOUP directly from the storage bin. The overhead hoist is then raised and retracted, as depicted in step 910, to move the FOUP within the overhead transport vehicle. In this way, the FOUP is top-loaded from the selected storage bin to the overhead transport vehicle. Finally, the overhead transport vehicle transports, as depicted in step 912, the FOUP to a workstation or processing machine on the product manufacturing floor.

It will further be appreciated by those of ordinary skill in the art that modifications to and variations of the above-described automated material handling system may be made without departing from the inventive concepts disclosed herein. Accordingly, the invention should not be viewed as limited except as by the scope and spirit of the appended claims.

What is claimed is:

1. An overhead transport vehicle comprising:
   a body;
   an overhead hoist; and
   a translating stage coupled to the overhead hoist and the body, the translating stage configured to extend from a retracted position inside the body along a horizontal axis to a first unretracted position to a first of two sides outside the body, to extend from the retracted position inside the body along the horizontal axis to a second unretracted position to the second of the two sides outside the body, the second side being different from the first side, and to move a gripper, wherein extension of the translating stage is configured to move the gripper from a first position within the body to a second position along the horizontal axis that is exterior to the body and adjacent to a side of the overhead transport vehicle;

wherein the gripper is configured to grip a FOUP;

wherein the overhead hoist is configured to enable vertical movement of the gripper.

2. The overhead transport vehicle of claim 1, wherein the gripper is further configured to place a FOUP on a load port.

3. The overhead transport vehicle of claim 2, wherein the gripper is further configured to retract to a starting position after placing the FOUP on the load port.

4. The overhead transport vehicle of claim 1, wherein the gripper is further configured to place the FOUP on a storage location.

5. The overhead transport vehicle of claim 4, wherein the gripper is further configured to retract to a starting position after placing the FOUP on the storage location.

6. The overhead transport vehicle of claim 1, wherein a load port is disposed on an integrated circuit chip manufacturing floor.

7. The overhead transport vehicle of claim 1, wherein the overhead transport vehicle is configured to extend a first distance below an integrated circuit chip manufacturing ceiling and a second distance above an integrated circuit chip manufacturing floor, with a load port being substantially disposed at the second distance from the integrated circuit chip manufacturing floor and at the first distance from the integrated circuit chip manufacturing floor ceiling.

8. The overhead transport vehicle of claim 1, wherein when the FOUP is transported to a load port, the gripper is configured to vertically move without horizontally moving the overhead hoist.

9. The overhead transport vehicle of claim 1, wherein when the FOUP is transported to the storage location, the overhead hoist is configured to be horizontally moved to the position above a storage location by the translating stage and the gripper is configured to vertically move.

10. The overhead transport vehicle of claim 1, wherein the gripper is configured to be vertically moved by the overhead hoist.

11. An overhead transport vehicle comprising:

a body;

an overhead hoist; and a translating stage coupled to the overhead hoist and the body, the translating stage configured to extend from a retracted position inside the body along a horizontal axis to a first unretracted position to a first of two sides outside the body, to extend from the retracted position inside the body along the horizontal axis to a second unretracted position to the second of the two sides, the second side being different from the first side, and move a gripper, wherein extension of the translating stage is configured to move the gripper from a first position within the body to a second position along the horizontal axis that is exterior to the body and adjacent to a side of the overhead transport vehicle;

wherein the overhead hoist is configured to enable vertical movement of the gripper;

wherein the gripper is configured such that the horizontal movement of the translating stage causes horizontal movement of the gripper and vertical movement of the translating stage causes vertical movement of the gripper; wherein the gripper is configured to pick up a FOUP from either of two sides of the overhead transport vehicle when the translating stage is fully extended beyond the body of the overhead transport vehicle.

12. The overhead transport vehicle of claim 11, wherein the gripper is further configured to place the FOUP on a load port.

13. The overhead transport vehicle of claim 12, wherein the gripper is further configured to retract to a starting position after placing the FOUP on the load port.

14. The overhead transport vehicle of claim 11, wherein the gripper is further configured to place the FOUP on a conveyor.

15. The overhead transport vehicle of claim 14, wherein the gripper is further configured to retract to a starting position after placing the FOUP on the conveyor.

16. The overhead transport vehicle of claim 11, wherein a load port is disposed on an integrated circuit chip manufacturing floor.

* * * * *